United States Patent [19]

Douglas

[11] Patent Number: 4,999,320
[45] Date of Patent: Mar. 12, 1991

[54] METHOD FOR SUPPRESSING IONIZATION AVALANCHES IN A HELIUM WAFER COOLING ASSEMBLY

[75] Inventor: Monte A. Douglas, Coppell, Tex.
[73] Assignee: Texas Instruments Incorporated, Dallas, Tex.
[21] Appl. No.: 356,585
[22] Filed: May 23, 1989

Related U.S. Application Data

[63] Continuation of Ser. No. 176,071, Mar. 31, 1988, abandoned.
[51] Int. Cl.⁵ .......................................... H01L 21/302
[52] U.S. Cl. ..................... 437/225; 437/248; 148/DIG. 31; 156/643; 156/345; 156/646
[58] Field of Search ................. 437/225, 228, 248; 29/569.1; 148/DIG. 131; 156/643, 646, 345

[56] References Cited
U.S. PATENT DOCUMENTS

| | | | |
|---|---|---|---|
| 4,260,884 | 4/1981 | Lovelock | 250/324 |
| 4,385,937 | 5/1983 | Ohmura | 437/17 |
| 4,444,618 | 4/1984 | Saia et al. | 156/643 |
| 4,450,568 | 5/1984 | Asmus | 372/76 |
| 4,468,284 | 8/1984 | Nelson | 156/643 |
| 4,565,601 | 1/1986 | Kakehi et al. | 156/646 |
| 4,687,543 | 8/1987 | Bowker | 156/643 |

OTHER PUBLICATIONS

"Single Wafer Triode Etcher", Solid State Technol., Mar. 1984, pp. 57–58.

Primary Examiner—Olik Chaudhuri
Assistant Examiner—Trung Dang
Attorney, Agent, or Firm—Melvin Sharp; James T. Comfort; James C. Kesterson

[57] ABSTRACT

A method for suppressing ionization avalanches in a single wafer dry etch reactor is provided. An electron scavenging agent is mixed with helium gas in a container (32). The mixture of helium and the agent is introduced through an inlet (34) to a chamber (30) formed between a wafer (24), an O-ring (26) and a powered cathode (16). As free electrons are accelerated through a potential drop in the inlet and outlet (34 and 40), the electron scavenging agent combines with electrons to form anions. Partially due to the fact that anions are too massive to reach the energy level required to ionize helium, ionization avalanches of helium are suppressed and, thus, there is no arcing in the inlet and outlet (34 and 40).

16 Claims, 1 Drawing Sheet

4,999,320

METHOD FOR SUPPRESSING IONIZATION AVALANCHES IN A HELIUM WAFER COOLING ASSEMBLY

This application is a Continuation, of application Ser. No. 07/176,071, filed 03/31/88 now abandoned.

TECHNICAL FIELD OF THE INVENTION

This invention relates in general to semiconductor devices, and in particular to a method for suppressing ionization avalanches in a helium wafer cooling assembly.

BACKGROUND OF THE INVENTION

There are generally two known techniques conventionally used to dry etch wafers: a batch wafer reactor or a single wafer reactor. In batch wafer reactors, a plurality of wafers are placed on powered substrates. Since a plurality of wafers are etched simultaneously, speed is not critical, and therefore batch reactors may operate efficiently at a low power density and at a process pressure of 0.001 to 0.5 torr in the Reactive Ion Etch (RIE) regime. The minimal heat generated by the etch process can be efficiently dissipated from the wafer to the substrate due to the low power density regime batch systems work within.

On the other hand, single wafer reactors such as, for example, plasma mode or magnetron ion etchers (MIE), can utilize high power densities to achieve high etch rates. Operating the single wafer etcher under a low pressure (5–500 millitorr) has also been found to aid anisotropic etching by reducing the concentration of species which may deflect the directional etching ions. Unfortunately, low pressure slows down the etch rate by limiting the concentration of available etchants.

In order to be competitive with a batch etcher, it is necessary for a single wafer etcher to etch at a faster rate than the batch etcher. The most frequently used method for increasing the etch rate is to increase the power density to the plasma in contact with the wafer. This results in a much higher heat load applied to the wafer that must be dissipated to prevent wafer thermal runaway which may promote unwanted lateral (isotropic) etching. Additionally, the very low pressures used to help control the anisotropic etching severely reduces (and practically eliminates) dissipation of heat through the surrounding atmosphere. Thus, it has been necessary to develop techniques to improve the cooling of a wafer in a single wafer reactor operating at high power densities and at low pressures.

One common cooling technique involves exposing the back side of the wafer (opposite the etch surface) to helium gas. A device known as a helium chuck has been developed specifically for cooling a wafer. A top layer of the chuck, which is proximate the silicon wafer to be etched, is cooled by a water system and is enhanced by a thermally conductive gas to transfer heat from the hot wafer to the cooled top layer of the etcher. Helium gas has typically been selected for use in the chuck because helium has the highest thermal conductivity of any known gas. However, other thermally conductive gases, such as, for example, neon or argon, may be used. A chuck requires input and output lines through the powered cathode to allow the flow of helium gas. Helium gas passes through the conductive layer, transfers heat from the back of the wafer and is then expelled.

The top layer of the helium chuck is powered in MIE and RIE (as well as some other plasma mode etchers) which may be used. In the RIE mode a high D.C. self-bias voltage develops within the chuck along with RF potentials resulting in significant D.C. and A.C. potential drops between the powered top layer and the grounded components coupled to the top layer, including the helium chuck cooling gas input and output lines. For example, in an RIE reactor, RF peak-to-peak voltages are around 3000 volts and D.C. voltages are commonly in excess of 1000 volts. Furthermore, during plasma ignition, the RF voltages may be considerably higher than 3000 volts. These high voltages result in a large potential drop within both the helium input and output lines. The potential drop frequently causes an ionization avalanche of helium which results in arcing, severe damage to the hardware and degradation of the wafer etching.

An ionization avalanche is caused by free electrons that have gained sufficient energy to ionize helium atoms. When other electrons are stripped from atoms, ions are created and more electrons are freed to create more ions. When enough energy is present, this process continues to progress creating an "avalanche" effect which eventually results in an electric arc. In a helium chuck there is more than enough energy available in the potential drop to create an avalanche.

The use of increased power combined with lower pressure in a single wafer etcher has created the need for a wafer cooling device. The addition of a wafer cooling device such as a helium chuck has added the problem of an ionization avalanche resulting from the potential drop across the helium chuck. Thus, there is a need for a way to prevent or greatly reduce ionization avalanches in a helium chuck cooling device.

SUMMARY OF THE INVENTION

The present invention disclosed herein comprises a method for suppressing ionization avalanches in a helium wafer cooling assembly which substantially eliminates or reduces the problems associated with wafer cooling assemblies. The present invention allows the formation of anions which are too large to be sufficiently energized to ionize a helium atom in the D.C. and A.C. electric fields that are present.

In accordance with one aspect of the present invention, a method for preventing an ionization avalanche of helium in a helium chuck during semiconductor wafer plasma etching is provided. An electron scavenging agent is mixed with the helium gas and the mixture is then passed through the helium chuck to cool the semiconductor wafer. The electron scavenging agent suppresses ionization of the helium by attaching with free electrons to form anions. The electron scavenging agent may comprise a gas from the polyatomic halogen containing species such as, for example, sulphur hexafluoride, sulphur tetrafluoride and carbon tetrachloride.

It is a technical advantage of the present invention that a single wafer dry etch reactor can operate at a high power level in low pressure without ionization avalanche damage to the wafer or the helium chuck.

BRIEF DESCRIPTION OF THE DRAWINGS

For a more complete understanding of the present invention, and for further advantages thereof, reference is now made to the following Detailed Description taken in conjunction with the accompanying Drawings in which.

DETAILED DESCRIPTION OF THE INVENTION

Figure 1:
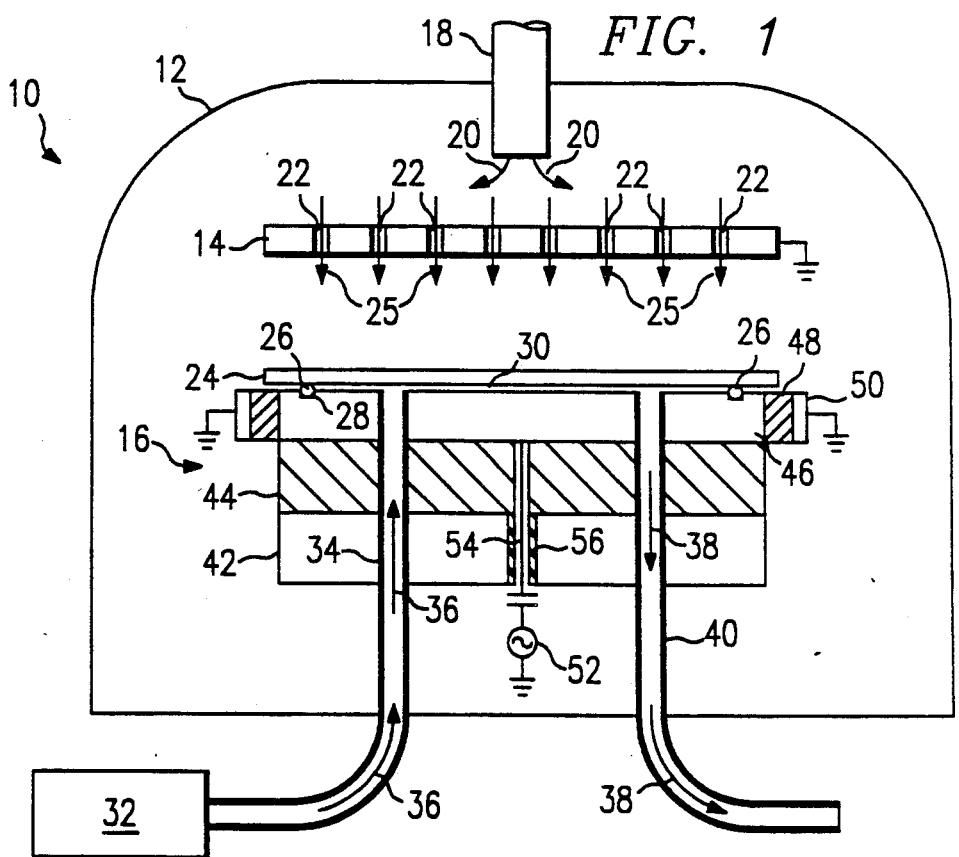
FIG. 1 is a cross-sectional view of a plasma mode etcher utilizing the present invention.

Referring to FIG. 1, a single wafer plasma mode etch reactor is generally identified by the reference numeral 10. The etch reactor 10 is enclosed in a vacuum by a cover 12. Cover 12 is sealed by appropriate means, not shown, to allow creation of a vacuum within by a vacuum pump, also not shown. The reactor 10 has a grounded anode 14 and a cathode 16 (cathode 16 is a powered electrode). Plasma gas is introduced through the cover 12 via inlet 18 as indicated by arrows 20. The plasma gas is directed through holes 22 in anode 14, similar to the action of a showerhead, and is pulled toward the wafer 24 for etching as indicated by arrows 25.

Wafer 24 is placed on an optional O-ring 26 which is fitted into an annular channel 28. O-ring 26, in conjunction with wafer 24, forms a chamber 30. Wafer 24 is held on O-ring 26 by any appropriate device such as clamps, not shown. The cathode 16 is water cooled by a device, not shown, as is well known in the art. A thermally conductive gas, for example, helium, is stored in a container 32 for release into the chamber 30 through an inlet 34 in the direction of arrows 36. After the thermally conductive gas transfers heat from the wafer 24 in chamber 30, the gas is removed in the direction of arrows 38 through the outlet 40. During the etching of the wafer 24, a constant flow of the thermally conductive gas is typically maintained through the chamber 30.

Although not shown, it is to be understood that the wafer may be placed and held directly on the surface of the cathode 16 without the use of an O-ring 26. Without the O-ring 26, the thermally conductive gas is used to transfer heat between the microscopic gaps between the silicon wafer 24 and the cathode 16.

The container 32 is used to pre-mix an electron scavenging agent with the thermally conductive gas. The scavenging agent may be, for example, any of the species having a large cross-section for electron attachment such as sulphur hexafluoride ($SF_6$), sulphur tetraflouride ($SF_4$), carbon tetrachloride ($CCl_4$) or any of the other polyatomic halogen-containing species. As will be subsequently described in greater detail, the electron scavenging agent acts to prevent free electrons from gaining sufficient energy to ionize the thermally conductive gas.

The cathode 16, as is well known in the art, comprises a first grounded layer 42, a second insulator layer 44 and a third conductive layer 46 which is cooled as previously described above. The third conductive layer 46 has an insulated rim 48 coated with a grounded conductor 50. A power source 52 is connected to third layer 46 by a conduit 54. First layer 42 is coated with an insulation material 56 adjacent the conduit 54. Insulation layer 44, insulated rim 48 and insulation material 56 may comprise, for example, teflon or ceramic, while conductive layer 46 may comprise, for example, aluminum.

The pressure within the cover 12 may be, for example, between 1 and 1000 millitorr. The cooling gas and scavenging agent mixture is maintained at a higher pressure, for example, 1-10 torr. The voltage applied to layer 46 creates a large potential drop between the powered third layer 46 and the grounded first layer 42 within the inlet 34 and the outlet 40.

Figure 2:
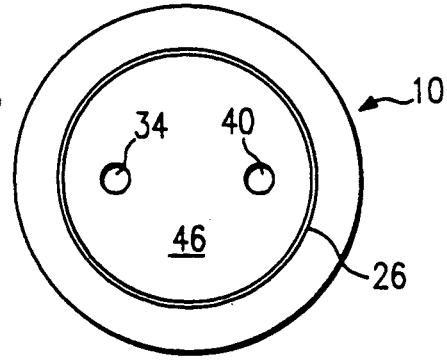
FIG. 2 is a plan view of a plasma etcher with the semiconductor wafer removed.

Referring to FIG. 2, a plan view of the etcher 10 is shown without the cover 12, the grounded anode 14 or the wafer 24. The powered cathode 46 has O-ring 26 therewithin and inlet 34 and outlet 40 conveniently located within the perimeter of O-ring 26.

In operation, a semiconductor wafer 24 is placed on O-ring 26 and secured in place. Cover 12 is closed and sealed by any appropriate means, not shown, and evacuated to the proper operating pressure.

Preferably, helium gas is mixed with an electron scavenging agent, for example, 0.01 to 10% by partial pressure of sulphur hexafluoride, in the container 32. Voltage is applied to the third layer 46 via the power source 52, and the plasma gas is introduced through the inlet 18 to the grounded anode 14. The gas mixture in container 32 is introduced to the chamber 30 via inlet 34.

Free electrons existing naturally are accelerated across the potential drop within the inlet and outlet tubes 34 and 40. Without the electron scavenging agent, the free electrons may quickly achieve the ionization energy level required to ionize helium. When the energy level of the electrons reaches the ionization energy requirement of helium, an avalanche occurs creating a damaging arc.

As is well known in the art, the electron is an important charged species in plasma ignition. However, due to its low mass, it may be sufficiently energized by an RF electric field to ionize a neutral species such as helium ($He + e = He^+ + 2e$). On the other hand, when the electron is attached to an atomic or molecular species to form an anion, the mass of the anion is too great to be sufficiently energized by an electric field to ionize the neutral species. Thus, the electron scavenging agent of the invention operates to prevent the ionization of helium and, thus, prevent damaging arcs.

EXAMPLE

The apparatus of FIG. 1 is operated as noted above while a scavenging agent of sulphur hexafluoride ($SF_6$) is introduced into the helium at 0.01%-10% by partial pressure. Sulphur hexaflouride ($SF_6$), plus free electrons will create associative anions or dissociative anions such as:

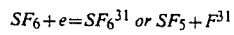

$$SF_6 + e = SF_6^{31} \text{ or } SF_5 + F^{31}$$

The associative anion ($SF_6^-$) and the dissociative anion ($F^-$) not only have too much mass and incur too many collisions to reach the ionization energy level required to ionize helium, but are also insufficiently reactive to ionize. Thus the creation of anions has been found to effectively suppress the ionization avalanching of helium and allows the etch process to proceed without damage to the wafer or the hardware.

Figure 3:
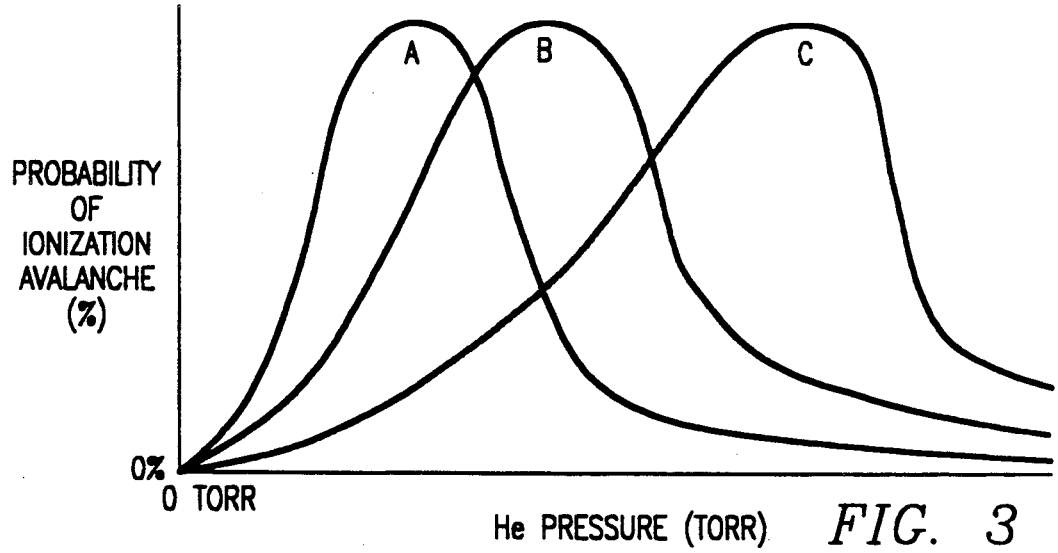
FIG. 3 is a graphic display of the probabilities of ionization avalanches of helium for various power outputs.

FIG. 3 illustrates the probability of the ionization of helium as a function of pressure for various power levels measured in watts. Line A illustrates the probability of ionization of helium with a 300 watt power source, line B represents the probability of helium ionization with a 500 watt power source and line C illustrates the probability of helium ionization with a 700 watt power source. Lines A, B and C reveal the fact that there is a zero percent probability of helium ionization only when there is no helium present.

It is unacceptable to operate at pressures low enough to provide a correspondingly low probability of ionization. Such a low pressure would allow wafer thermal runaway and undesirable etch characteristics.

Similarly, it is unacceptable to operate at pressures high enough to obtain an acceptably low probability of ionization. High pressures would force the wafer to bow outwardly in a convex shape due to the differences in pressure on opposite sides of the wafer, resulting in nonuniform wafer-to-substrate contact that results in nonuniform etch characteristics. Therefore, it is necessary, at all pressures and all power levels, to provide a mechanism to suppress ionization of helium. The present invention herein disclosed accomplishes this previously unfulfilled need.

Alternatively, many other gases and gas combinations may be utilized. While helium may have the highest thermal conductivity of known gases, other less thermally conductive gases may be chosen. Also, the addition of an electron scavenging agent can vary up to 100% of the mixture. Since nearly all gases have thermally conductive characteristics, the electron scavenging agent may entirely comprise the thermally conductive gas. The gases selected obviously depend on whatever trade-offs are desired, for example, high thermal conductivity versus low electron scavenging, high electron scavenging versus low thermal conductivity or somewhere in between.

Although the present invention has been described with respect to a specific preferred embodiment thereof, various changes and modifications may be suggested to one skilled in the art, and it is intended that the present invention encompass such changes and modifications as fall within the scope of the appended claims.

What is claimed is:

1. A method for preventing arc damage in a semiconductor wafer processing apparatus having a cooling device, comprising the steps of:
    mixing a thermally conductive gas with an electron scavenging agent; and
    introducing said mixed thermally conductive gas and electron scavenging agent into the cooling device.

2. The method of claim 1, wherein the scavenging agent consists of sulfur hexafluoride;
    and wherein the step of mixing comprises mixing between 0.01 to 10 percent by partial pressure of said scavenging agent with said thermally conductive gas.

3. The method of claim 1, wherein the step of mixing occurs before the step of introducing.

4. The method of claim 1, further comprising:
    disposing a wafer near an electrode having first and second conductive layers, said first and second conductive layers insulated from one another, said first conductive layer disposed between said second conductive layer and said wafer; and
    powering said first conductive layer of said electrode relative to said second conductive layer;
    wherein said introducing step introduces said mixed thermally conductive gas and electron scavenging agent to said wafer through said electrode.

5. A method for suppressing ionization avalanches in a thermally conductive gas during semiconductor wafer plasma etching, comprising the steps of:
    mixing an electron scavenging agent with the thermally conductive gas;
    cooling the semiconductor wafer with said agent and the thermally conductive gas; and
    creating anions by combining the electron scavenging agent with electrons, said anions suppressing ionization avalanches of the thermally conductive gas.

6. The method of claim 5, wherein the step of mixing an electron scavenging agent with thermally conductive gas comprises mixing any of the species having a large cross-section for electron attachment with helium.

7. The method of claim 5, further comprising:
    disposing a wafer near an electrode having first and second conductive layers, said first and second conductive layers insulated from one another, said first conductive layer disposed between said second conductive layer and said wafer; and
    powering said first conductive layer of said electrode relative to said second conductive layer;
    wherein said cooling step comprises introducing said mixed thermally conductive gas and electron scavenging agent to said semiconductor wafer through said electrode.

8. A method for suppressing helium ionization in a single wafer etch reactor, comprising the steps of:
    enhancing the cooling of a semiconductor wafer with helium gas;
    mixing an electron scavenging agent with said helium; and
    merging said agent with free electrons to create anions, said anions suppressing helium ionization.

9. The method of claim 8, wherein the step of mixing comprises mixing sulfur hexafluoride with helium.

10. The method of claim 8, wherein the step of mixing comprises mixing sulfur tetraflouride with helium.

11. The method of claim 8, wherein the step of mixing comprises mixing carbon tetrachloride with helium.

12. The method of claim 8, further comprising:
    disposing a wafer near an electrode having fist and second conductive layers, said first and second conductive layers insulated from one another, said first conductive layer disposed between said second conductive layer and said wafer; and
    powering said first conductive layer of said electrode relative to said second conductive layer;
    introducing said mixed helium and electron scavenging agent between said wafer and said electrode.

13. A method for cooling a semiconductor wafer in a single wafer etch reactor to prevent arc damage from ionization of a thermally conductive gas, comprising the steps of:
    cooling the wafer with a helium chuck utilizing helium gas as the thermally conductive gas;
    adding an electron scavenging agent to said helium gas; and
    creating anions when said agent encounters free electrons, said anions preventing arc damage by suppressing ionization of said helium gas.

14. The method of claim 13, wherein the step of creating anions comprises creating associative anions.

15. The method of claim 13, wherein the step of creating anions comprises creating dissociative anions.

16. The method of claim 13, wherein said chuck has first and second conductive layers, said first and second conductive layers insulated from one another, said first conductive layer disposed between said second conductive layer and said wafer; and
    and further comprising:
    powering said chuck;
    wherein said cooling step comprises pumping said helium gas with said added electron scavenging agent between said wafer and said chuck through said second conductive layer.

* * * * *